(12) United States Patent
Roesner et al.

(10) Patent No.: US 10,672,716 B2
(45) Date of Patent: Jun. 2, 2020

(54) INTEGRATED CIRCUIT SUBSTRATE AND METHOD FOR MANUFACTURING THE SAME

(71) Applicant: Infineon Technologies AG, Neubiberg (DE)

(72) Inventors: Michael Roesner, Villach (AT); Gudrun Stranzl, Gödersdorf (AT); Manfred Engelhardt, Villach-Landskron (AT); Martin Zgaga, Rosegg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/029,934

(22) Filed: Jul. 9, 2018

(65) Prior Publication Data
US 2018/0315713 A1  Nov. 1, 2018

Related U.S. Application Data

(62) Division of application No. 14/698,639, filed on Apr. 28, 2015, now Pat. No. 10,020,264.

(51) Int. Cl.
| | | |
|---|---|---|
| *H01L 23/544* | (2006.01) | |
| *H01L 21/78* | (2006.01) | |
| *H01L 21/3065* | (2006.01) | |

(52) U.S. Cl.
CPC ...... *H01L 23/544* (2013.01); *H01L 21/30655* (2013.01); *H01L 21/78* (2013.01); *H01L 2223/5446* (2013.01); *H01L 2223/54413* (2013.01); *H01L 2223/54433* (2013.01); *H01L 2223/54473* (2013.01)

(58) Field of Classification Search
CPC .......................... H01L 21/30655; H01L 22/20
See application file for complete search history.

(56) References Cited

U.S. PATENT DOCUMENTS

| | | | |
|---|---|---|---|
| 4,567,361 A * | 1/1986 | Rosenthal | B07C 5/3412 235/385 |
| 4,896,034 A | 1/1990 | Kiriseko | |
| 5,654,588 A * | 8/1997 | Dasse | G01R 31/2831 257/204 |
| 5,800,906 A | 9/1998 | Lee et al. | |
| 6,069,091 A * | 5/2000 | Chang | H01L 21/3065 257/E21.218 |
| 6,420,792 B1 | 7/2002 | Guldi et al. | |
| 6,531,068 B2 | 3/2003 | Laermer et al. | |
| 7,186,945 B2 | 3/2007 | He et al. | |
| 7,911,036 B2 | 3/2011 | Bradl et al. | |
| 8,173,534 B2 | 5/2012 | Bradl et al. | |
| 8,742,599 B2 | 6/2014 | Rampley et al. | |

(Continued)

FOREIGN PATENT DOCUMENTS

| | | |
|---|---|---|
| CN | 1713348 A | 12/2005 |
| CN | 104009000 A | 8/2014 |

*Primary Examiner* — Moazzam Hossain
(74) *Attorney, Agent, or Firm* — Slater Matsil, LLP

(57) ABSTRACT

An integrated circuit substrate and a method for manufacturing the same are disclosed. In an embodiment a method includes providing a wafer having a plurality of active areas, each active area being provided in a separate die area and for each active area, providing a code pattern outside the active area, the code pattern being associated with the die area.

17 Claims, 6 Drawing Sheets

(56) References Cited

U.S. PATENT DOCUMENTS

| | | |
|---|---|---|
| 8,822,141 B1 | 9/2014 | Farooq et al. |
| 2002/0179709 A1 | 12/2002 | Mehler |
| 2004/0257572 A1 | 12/2004 | Stacker |
| 2004/0259277 A1 | 12/2004 | Hofmeister |
| 2005/0042780 A1 | 2/2005 | Matsunami |
| 2005/0047543 A1 | 3/2005 | Sandstrom |
| 2005/0189418 A1 | 9/2005 | Hammerschmidt |
| 2005/0272174 A1* | 12/2005 | Duan ................ G01R 31/2884 438/18 |
| 2005/0275062 A1 | 12/2005 | Matsuda |
| 2006/0281324 A1* | 12/2006 | Launay ............ H01L 21/30655 438/710 |
| 2007/0216004 A1 | 9/2007 | Brunnbauer et al. |
| 2008/0156780 A1* | 7/2008 | Voronov ................ B41J 2/442 219/121.69 |
| 2010/0237514 A1 | 9/2010 | Richter et al. |
| 2010/0279231 A1 | 11/2010 | Sandtner |
| 2010/0300259 A1 | 12/2010 | Lee |
| 2012/0322271 A1 | 12/2012 | Wang et al. |
| 2013/0230974 A1* | 9/2013 | Martinez .......... H01L 21/68771 438/464 |
| 2014/0061952 A1* | 3/2014 | Rampley .............. H01L 23/544 257/782 |
| 2014/0232006 A1* | 8/2014 | Vielemeyer ............. H01L 23/48 257/773 |
| 2015/0011088 A1* | 1/2015 | McNie ................... C23C 16/52 438/689 |
| 2015/0370175 A1 | 12/2015 | Nicolaides et al. |
| 2016/0135274 A1* | 5/2016 | Fischer ................. H05G 2/003 438/9 |
| 2016/0322306 A1* | 11/2016 | Roesner ............ H01L 21/30655 |
| 2017/0221076 A1 | 8/2017 | Soborski |

\* cited by examiner

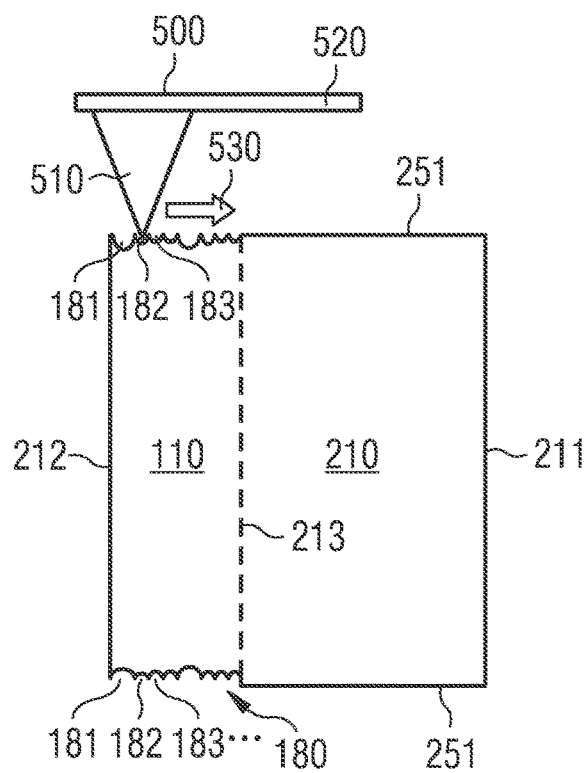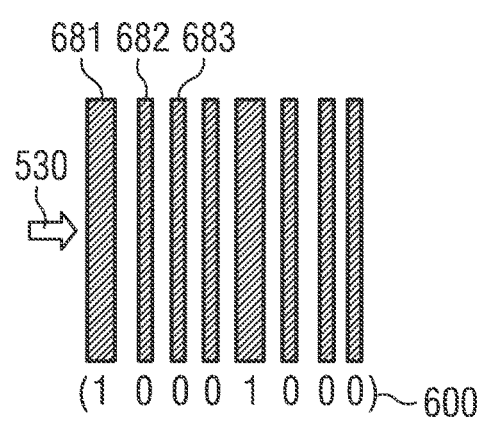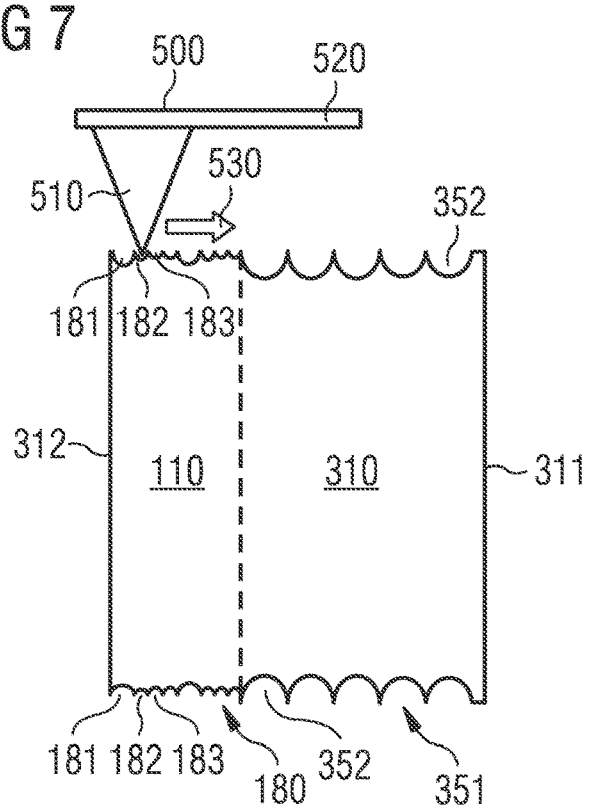

INTEGRATED CIRCUIT SUBSTRATE AND METHOD FOR MANUFACTURING THE SAME

CROSS-REFERENCE TO RELATED APPLICATIONS

This application is a divisional of U.S. patent application Ser. No. 14/698,639, filed on Apr. 28, 2015, which application is hereby incorporated herein by reference.

TECHNICAL FIELD

The present disclosure relates to manufacture of integrated circuit chips.

BACKGROUND

Many circuit chips are made from silicon crystals. Typically, the crystal is cut into slices, so-called wafers. The wafers are processed in batches, for example one batch including 25 wafers, in which case the batch of wafers is called a lot. During wafer processing, multiple instances of integrated circuits are formed on each wafer of the lot. Each integrated circuit defines an active area on the wafer. Thus, multiple active areas are created on the wafer. In a later step in processing the wafer, wafer material is removed from some of the spaces between active areas, whereby trenches, so-called scribe lines, are formed in the wafer surface. Typically, the multiple integrated circuits formed on the wafer are eventually separated from one another by breaking, sawing, or cutting the wafer along the scribe lines, each integrated circuit to form a so-called die. Once the multiple integrated circuits that were formed on the wafer are separated from one another, the dies are, for example, each set to a die frame that holds the die during further steps of manufacturing the circuit chip.

Sometime after manufacturing the integrated circuit chip, the integrated circuit may turn out to malfunction. The cause of the malfunction may need investigation, for example with a view to avoidance of future malfunction of similar products and/or in order to remove a cause for the malfunction in products still to be manufactured, and/or in order to identify an entity that is to be held responsible for the malfunction. However, there is no possibility to investigate the exact cause of the malfunction to the extent that it occurred in a particular lot of wafers and/or position on a wafer.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention.

FIG. 5 is a sectional side view that schematically illustrates a performing a pattern detection on a die substrate as illustrated in FIG. 2 according to some embodiments.

FIG. 6 is an illustration of a code according to some embodiments.

FIG. 7 is a sectional side view that schematically illustrates a performing a pattern detection on a die substrate as illustrated in FIG. 3 according to some embodiments.

As used herein, like terms refer to like elements throughout the description.

Figure 1:
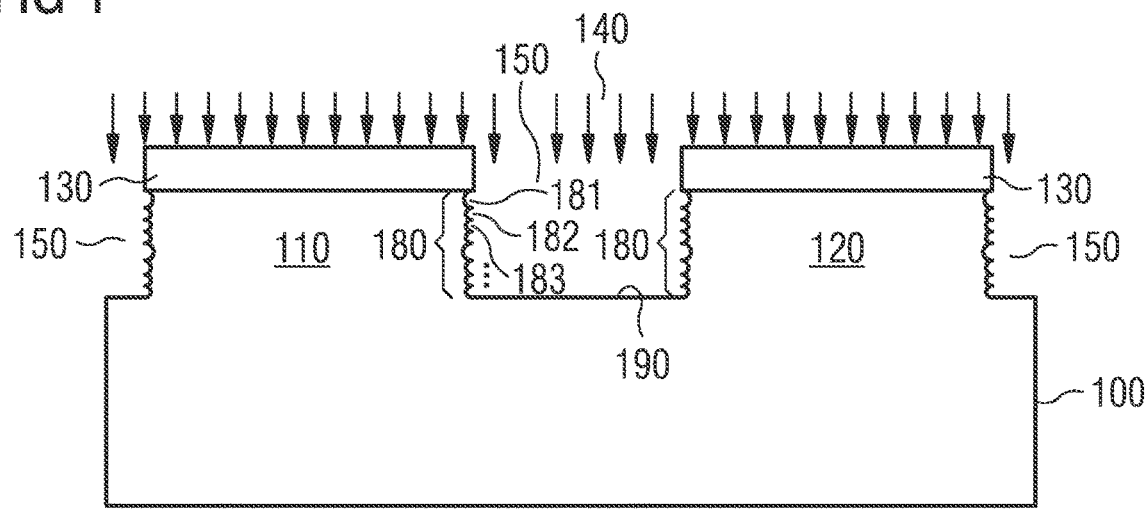
FIG. 1 is a diagram schematically illustrating a sectional side view of a section of a wafer 100 according to some embodiments.

The elements of the drawings are not necessarily to scale relative to each other. Like reference numerals designate corresponding similar parts. Because components of embodiments according to the present invention can be positioned in a number of different orientations, directional terminology may be used for purposes of illustration that, however, is in no way limiting, unless expressly stated to the contrary.

Other embodiments according to the present invention and many of the intended advantages of the present invention will be readily appreciated as they become better understood by reference to the following detailed description. It is to be understood that other embodiments may be utilized and structural or logical changes may be made without departing from the scope of the present invention. The following detailed description, therefore, is not to be taken in a limiting sense, and the scope of the present invention is defined by the appended claims.

DETAILED DESCRIPTION OF ILLUSTRATIVE EMBODIMENTS

Below, embodiments, implementations and associated effects are disclosed with reference to the accompanying drawings.

FIG. 1 is a diagram schematically illustrating a sectional view of a section of a wafer 100 according to some embodiments. The wafer is made from a semiconductor material such as silicon, silicon carbide, gallium nitride or gallium arsenide. In some embodiments the wafer is made of, comprises or substantially includes a foil, for example, a plastic foil or a metal foil. The wafer 100 of FIG. 1 underwent process steps to form a number of structurally identical integrated circuits in chip portions.

For the purpose of illustration, the section of wafer 100 that is shown includes two chip portions, herein also referred to as integrated circuit (IC) portions 110, 120. However, it should be understood that the wafer 100, along one cross-section, depending on the length of the cross-section and the size of an individual chip substrate, can provide tens of chip portions or even hundreds of chip portions. As the substrate originates from the wafer, the substrate material is that of the wafer. Subsequent to forming the integrated circuits, IC portions 110, 120 were covered by a mask layer 130. In some embodiments mask layer 130 is provided by a resist. In some embodiments, using a lithography photomask, selected portions of the resist, that is, those portions that cover IC portions 110, 120, were exposed to light so as to turn resistive to subsequent etching process steps.

Embodiments of the invention apply to integrated circuits that include many transistors, e.g., thousands or millions, interconnected to form any number of devices, such as processors, controllers or anything else. On the other hand, the invention applies equally to embodiments that have only a single transistor, e.g., a power MOSFET. In fact, the device does not require any transistors, e.g., a MEMS device.

Next, in some implementations, the resistive layer 130 of wafer 100 was exposed to etching, as indicated in FIG. 1 by arrows 140. Those portions of the resistive layer 130 were exposed to light and thus made resistive to etching, withstood the etching. In contrast, other portions of the resistive layer 130 that were not previously exposed to light, did not withstand the etching. As a consequence, in those portions the mask 130 was removed and trenches 150 with a bottom 190 and with sidewalls 180 were formed. As will be explained in more detail below, according to some implementations, trenches 150 define scribe lines along which the wafer 100 is to be separated into individual chips.

In some embodiments etching is performed using anisotropic plasma etching. In some embodiments the anisotropic plasma etching is performed by alternating repeatedly between a first process phase and a second process phase. The first process phase is a plasma etching phase that, in some implementations, is essentially isotropic. The second process phase is a deposition of a passivation layer that to protect the substrate from chemical activity caused by reactive ions supplied during the plasma etching phase. In some embodiments the passivation layer is chemically inert. In some implementations, during the plasma etching phase, directional ions bombard the substrate and attack the passivation layer at the bottom 190 of the trenches 150 more than the trenches' sidewalls 180.

Therefore, the passivation layer the bottom 190 of the trenches is quickly removed while the passivation layer on the side walls 180 essentially protects the sidewalls 180 from etching for a duration of the plasma etching phase that is predetermined as will be described in more detail below. As a consequence, anisotropic etching is performed, that is, at the bottom of the trenches 150, vertical etching at a vertical etching rate, and, at the walls 180 of the trenches 150, lateral etching at a lateral etching rate. The lateral etching rate differs from the vertical etching rate. In some implementations the vertical etching rate is controlled to be larger than the lateral etching. In some implementations the vertical etching rate is controlled to be larger than the lateral etching rate by more than an order of magnitude. For example, a deep reactive-ion technique is used such as a technology known as Bosch process.

In some implementations passivation phase and etching phase alternate several times a minute. More particularly, the length of the passivation phase determines, amongst other factors, the thickness of passivation layer. Likewise, the length of the etching phase determines, amongst other factors, an extent to which the passivation layer is removed. As described above, at the bottom 190 of the trenches 150, the passivation layer is quickly removed such that vertical etching takes place during most of the duration of the etching phase. However, on the sidewalls 180 of the trenches 150, the passivation layer, in some embodiments, is slowly removed such that lateral etching hardly takes place at all during the etching phase. However, once the passivation layer is removed from the sidewalls 180 lateral etching proceeds on the sidewalls.

In accordance with the teaching disclosed herein, in some implementations the duration of the etching phases is selectively controlled so as to provide lateral etching during some of the etching phases so as to form grooves, so-called scallops 181, 182, 183, . . . , in the sidewalls 180. During each etching phase one scallop 181, 182, 183, . . . is formed in the sidewalls 180 of those trenches 150 that are exposed to etching.

According to some embodiments selective control of lateral etching is performed in order to form a code in sidewall 180. In some implementations the code represents information indicative of the lot that the processed wafer belongs to. In other implementation, the code could represent a facility (a "fab") in which the wafer was fabricated. In the example shown in FIG. 1 the code is represented by a sequence of scallops of varying size provided in the vertical direction, that is, in a direction from the surface to the bottom of trenches 150. As illustrated in FIG. 1, by modulating the etching phases, that is, by selectively controlling the duration of each etching phase, scallops can be formed to differ in size. For example, in some embodiments scallops of two different sizes are formed such as scallops of a large size, for example scallop 181, and scallops of small size, for example scallops 182 and 183.

For the purpose of coding, for example, in one implementation a small scallop represents a bit value zero and a large scallop represents a bit value one. In another implementation a large scallop represents a bit value zero and a small scallop represents a bit value one. It should be understood that the teaching disclosed herein is not limited to forming scallops in two different sizes; the person skilled in the art could also implement the teaching with forming scallops of more than two different sizes, wherein the different value is assigned to each size.

In the example of FIG. 1 the anisotropic etching process was performed in eight etching phases, wherein the first phase and a fifth phase lasted longer to provide large scallops 181 and the other phases such as the second phase and the third phase lasted shorter to provide small scallops 182, 183. Thus, in the example illustrated in FIG. 1 that shows, from top to bottom, a large scallop, three small scallops, another large scallop, and another three small scallops, an 8-bit sequence (10001000) or (01110111) is coded into the side wall 180. However, it should be understood that the person skilled in the art could choose the length of the bit sequence coded into the side wall 180 to be shorter for example, 4-bit, or longer, for example 16-bit. In practice, structural considerations as well as process technology considerations will lead the person skilled in the art to a suitable choice of coding by forming scallops in the sidewalls 180.

In some implementations the scallop coding is formed in a portion of the side wall 180 that encases the integrated circuit, while a portion of the side wall 180 that encases the substrate beneath the integrated circuit is blank. In some embodiments the portion of the side wall 180 encases the integrated circuit at least to the extent that the integrated circuit is formed atop the substrate. Herein the wording 'blank' means that the surface does not have any information encoded thereon. In some implementations scallop coding is also formed in the portion of the side wall 180 that encases the substrate. At least one effect can be that a surface available for code is larger so that more information can be encoded. One effect can be that, in order to encode a given amount of information, scallop dimensions, in particular a scallop width, need to be less precise.

While in the example the anisotropic etching is performed the same across the complete wafer, in some implementations performance of the anisotropic etching depends in a predetermined fashion on location on the wafer. For example, the wafer surface could be thought of in terms of four quadrants and the coding process described above with reference to the complete wafer surface could be performed differently from one quadrant to another, for example by exposing the photoresist in one quadrant to light longer than in other quadrants.

Figure 2:
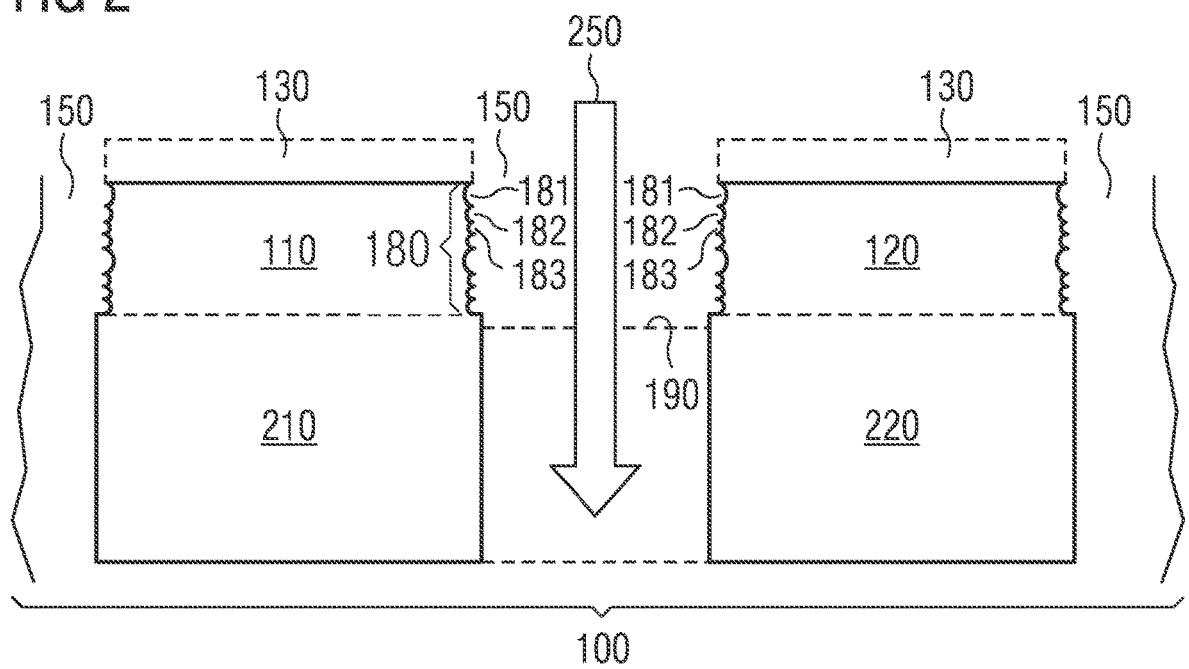
FIG. 2 is a diagram schematically illustrating a sectional side view of die substrates cut from a wafer according to some embodiments.

Further processing in accordance with some embodiments is now described with reference to FIG. 2 that is a diagram schematically illustrating a lateral side view of substrates cut from a wafer according to some embodiments. After having undergone an implementation of the above-described process, wafer 100 illustrated in FIG. 1 is further processed. For example, resist layer 130 is removed (its former position as indicated in FIG. 2 by a dotted line). In some embodiments further processing includes a separation of the chips provided with the wafer 100 so as to obtain chip substrates 310, 320 that carry the integrated circuit included in the IC portion 110 and 120, respectively. In some implementations, as indicated in FIG. 2 by an arrow 250, the wafer 100 is cut along the trenches 150. Cutting the wafer can be performed, for example by laser dicing, mechanical dicing, or stealth dicing.

Further processing in accordance with some other embodiments is now described with reference to FIG. 3 that is a diagram schematically illustrating a lateral side view of substrates cut from a wafer according to some embodiments. After having undergone an implementation of the process described above with reference to FIG. 1, wafer 100 illustrated in FIG. 1 is further processed. According to the implementations illustrated in FIG. 3, after having performed the scallop coding described above with reference to FIG. 1, resist layer 130 is left in place and etch dicing is performed using, again, anisotropic etching. In some embodiments, first, another passivation phase is performed.

Next, another etching phase is performed. The another etching phase deepens a trench 350 into the substrate of wafer 100 below a level 330 of a lowest layer of integrated circuitry that is provided in integrated circuit portions 110, 120. In the process, first dicing scallops 351 are formed in the side walls 180 of trenches 150. As described above with reference to forming the scallop coding 181, 182, 183, . . . , passivation phase and etching phase are alternately repeatedly performed. In some implementations of etch dicing, the repeating is performed until all wafer substrate that is not covered by the mask 130 is etched away. At that point chip substrate 210 and chip substrate 220 are separated from one another. In some implementations etching is performed in larger steps than in the above described implementations of code etching.

Figure 3:
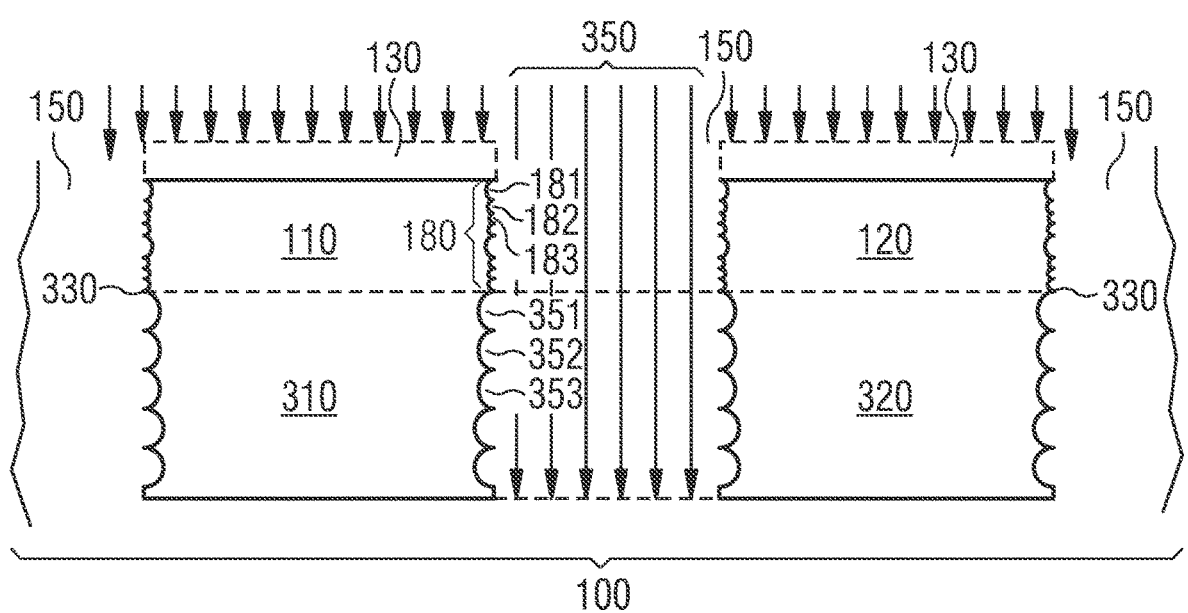
FIG. 3 is a diagram schematically illustrating a lateral side view of die substrates separated from a wafer according to some embodiments.

As a result, as illustrated in FIG. 3, in some implementations, dicing scallops 351, 352, 353, . . . that are formed in the etch dicing process are larger than code scallops 181, 182, . . . that are formed during the edge coding process. At least one effect can be a reduction of the duration of the etching required to complete the etch dicing. Thus, an effect can be improved efficiency.

Figure 4:
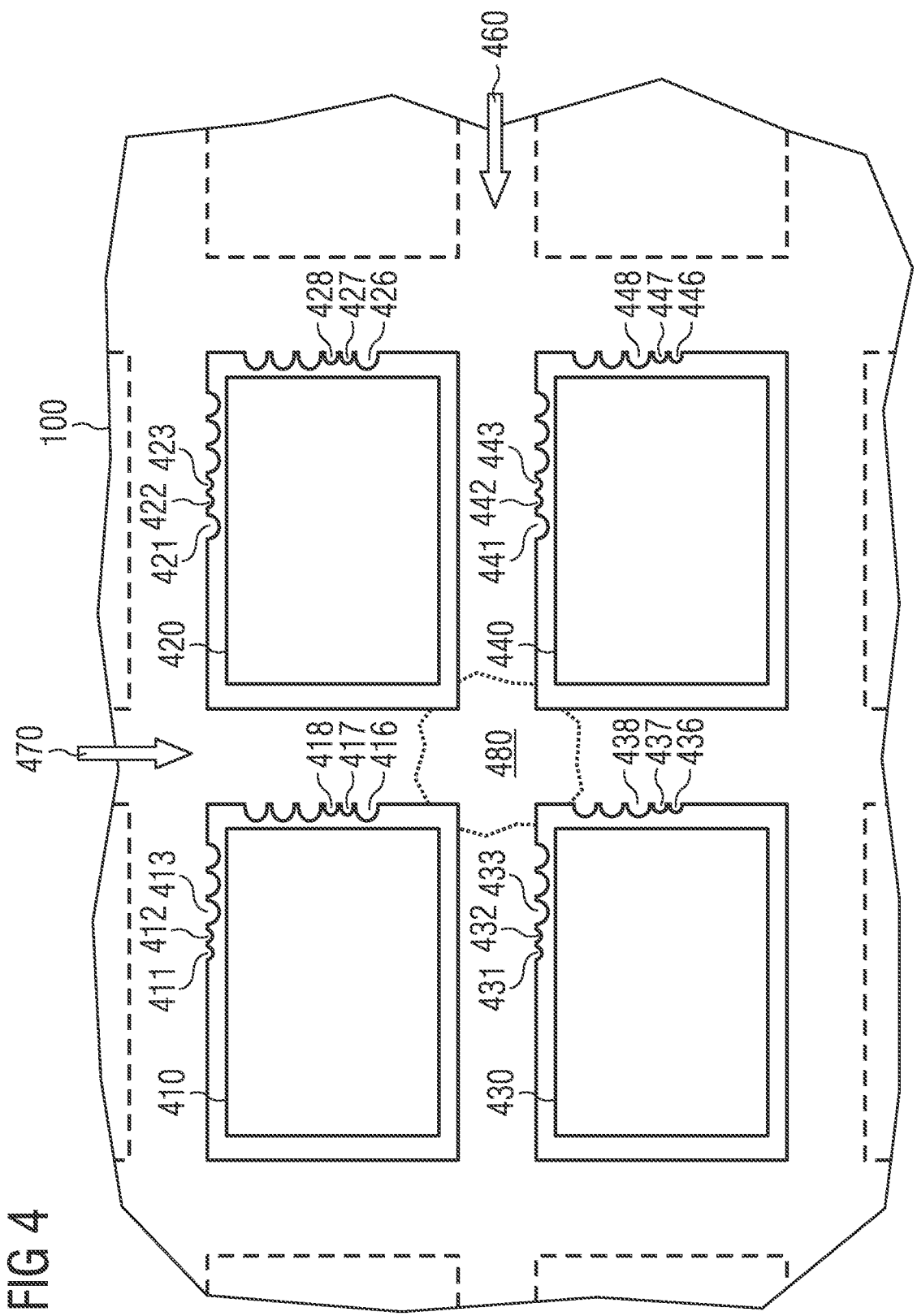
FIG. 4 is a diagram schematically illustrating a top view onto a wafer according to some embodiments.

FIG. 4 is a diagram schematically illustrating a top view onto exemplary substrate portions to be cut, for example from the wafer 100 shown in FIG. 1 in order to provide integrated circuit chip substrates. The wafer 100 includes multiple integrated circuit portions, herein referred to as active portions 410, 420, 430, 440, . . . . The active portions 410, 420, 430, 440, . . . are separated from one another by laterally extending kerf portions 460, 470. More particularly, in the example shown a first kerf portion 460 extends in an X direction and a second kerf portion 470 extends in the Y direction that is orthogonal to the X direction. Thus, the kerf portions 460, 470 form an array on wafer 100. First kerf portion 460 and second kerf portion 470 meet at a kerf junction 480. Thus, the array provides rectangular fields, wherein each field comprises one active portion 410, 420, 430, 440, . . . . It should be understood that the person skilled in the art could think of other forms, ways and shapes to divide up wafer 100 into integrated circuit chip substrates. Further, it should be understood that FIG. 4 merely illustrates an exemplary section of the wafer 100. In some embodiments the wafer 100 hosts hundreds, if not thousands, of active portions 410, 420, 430, 440, . . . , each to become an individual integrated circuit chip substrate, herein also referred to as integrated circuit die, or, shortly, die.

In some embodiments each active portion 410, 420, 430, 440, . . . comprises an integrated circuit. In some implementations integrated circuit of every active portion 410, 420, 430, 440, . . . is the same. In some implementations the wafer 100 is used to manufacture substrates that include more than one type of integrated circuit. Consequently, in such implementations not every active portion includes the same integrated circuit. In the illustration of FIG. 4 the active portions 410, 420, 430, 440, . . . are covered by a mask and, consequently, nothing of the respective active portion's integrated circuit is shown. In some embodiments the mask is provided by a resist as described above, for example, with reference to FIG. 1.

In the kerf portions, just outside active portions 410, 420, 430, 440, . . . , scallops are formed. In some embodiments are adjacent to the active portion 410, 420, 430, 440. For example, looking at the bottom left quadrant of FIG. 4, the portion of the wafer 100 that includes active portion 430 is provided with scallops 431, 432, 433, . . . formed in the kerf portion 460 along the X direction. Still looking at the bottom left quadrant of FIG. 4, the portion of the wafer 100 that includes active portion 430 is provided with scallops 436, 437, 438, . . . formed in the kerf portion 470 along the Y direction. In some embodiments the scallops are provided with one of two different width, i.e., the scallops are either narrow or wide. For example, in the first kerf portion 460 a first scallop 431 and a second scallop 432 are narrow-width scallops, and a third scallop 433 is a wide-width scallop.

Likewise, to give another example, in the second kerf portion 470, a first scallop 436 and a second scallop 437 are narrow-width scallops, and a third scallop 438 is a wide-width scallop. Thus, the scallops provide a first binary pattern formed adjacent to the active portion 430 along the direction of the first kerf portion 460 and second binary pattern formed adjacent to the active portion 430 along the direction of the second kerf portion 470. As is illustrated in FIG. 4, the number of scallops in one direction adjacent to one active portion is not limited to three but come the larger, whereby it sequences larger than three can be represented by a sequence of scallops. Though not illustrated in FIG. 4, in some embodiments a number of widths available to form the scallops can be larger than two, for example scallops can be formed to have one of small, medium, and large width, whereby one scallop can encode more information than can be represented by one bit.

In some embodiments, as in the example illustrated in FIG. 4, a sequence of narrow and wide scallops 431, 432, 433 and 441, 442, 443 formed adjacent to active portions 410 and 430 that are located in the same column of fields of the array on wafer 100 is the same for all active portions 410 and 430 in the same column while being different for all other active portions 420 and 440. Likewise, a sequence of narrow and wide scallops 416, 417, 418 and 426, 427, 428 formed adjacent to active portions 410 and 420 that are located in the same row of fields of the array on wafer 100 is the same for all active portions 410 and 420 in the same row while being different for all other active portions 430 and 440. At least one effect can be that each active portion that is associated with adjacent sequences of scallops is not only uniquely marked by the sequences of adjacent scallops, but it's position in the array of fields formed on wafer 100 is encoded in the sequences of scallops. Thus, provided the code is known, a position of an active portion 410 on wafer 100 can be "read" from looking at the sequences of wide and narrow scallops that are formed adjacent to the active portion 410.

In FIG. 4, the narrow and wide scallops 416, 417, 418 and 426, 427, 428 are shown to extend laterally along the edge of the dies. This can be accomplished by conventional process photolithography techniques. This embodiment could be useful, for example, to identify the facility in which the wafers are being fabricated. In other words, the lithography mask that is used to define the scribe lines could be modified to include a code as shown in FIG. 4. The shapes could be scallops as illustrated or any other shape to generate a code.

It is understood that the embodiment as shown in FIG. 4 can also be an embodiment as shown in FIG. 1 (as the exemplary wafer 100 described therein). The pattern seen in FIG. 4 enables to associate a singulated die with its position on the wafer before dicing. An effect can be that, in combination with the modulated etching pattern associated with the wafer lot, the die is almost uniquely identifiable. At any rate, the embodiment in FIG. 4, even without a vertical pattern provided by modulated etching, is covered by the claim element of providing, for each active area, a code pattern outside the active area, the code pattern being associated with the integrated circuit (inside the active area).

Now, reading information encoded into the side walls, in particular detection of information, will be described with reference to FIG. 5 which is a sectional side view that illustrates the chip substrate 210 according to some embodiments that result from processing the wafer 100 as described above with reference to FIG. 2. Chip substrate 210 has a bottom surface 211 and is formed with a circuit portion 110 having a top surface 212. A boundary between chip substrate 210 and the circuit portion 110 is indicated by a dotted line 213; however, it should be understood that the chip substrate 210 with the integrated circuit portion 110 formed on top is provided essentially as a monolith. Having regard to the chip substrate 210, sidewalls 251 form an essentially blank surface wall of the chip substrate 210, i.e., the surface of sidewall 251 does not have any information encoded thereon. As described above, the sidewalls 251 result from mechanically dicing the wafer 100, for example, when cutting the wafer 100 along the scribe lines such as by cutting along trench 150 (see FIG. 1). Having regard to the integrated circuit portion 110, sidewalls 180 are formed with scallop code as described above with reference to FIG. 1.

Detection of the scallop code, according to some embodiments, is performed mechanically. In some implementations a profilometer 500 is used that has a detection spike 510 mounted on an arm 520. In some embodiments the profilometer 500 is set near the side wall 180. In some embodiments the profilometer 500 is configured to detect a distance between the tip of the detection spike 510 and the surface of the side wall 180 and to output a signal indicative of that distance for processing in a profile detection unit (not shown) of the profilometer 500. In some embodiments the profilometer 500 is configured to track the surface of side wall 180 by keeping constant the distance between the tip of the detection spike 510 and the surface of the side wall 180 while the profilometer 500 is driven in a direction that is transverse, for example perpendicular, to longitudinal axes of the scallops 181, 182, 183, . . . , formed in the side wall 180. In some embodiments the profilometer 500 is configured to move the substrate relative to the detection spike 510. Control signals used in drive control of the profilometer 500 reflect the profile of the surface of the sidewall surface 180. The profilometer 500 outputs the control signals or signals derived from the control signals for further processing in the profile detection unit. The profile detection unit or another processing unit that is in receipt of data representative of the detected profile, from the detected profile, extracts information on a sequence of scallops 181, 182, 183, . . . , and the respective scallop width in order to derive a barcode that is formed in the side wall 180.

An example of a barcode is illustrated in FIG. 6 that is an illustration of a barcode according to some embodiments. The barcode represents the 8-bit sequence (10001000) as shown, for example, at reference numeral 600. As described above with reference to FIG. 1, the 8-bit sequence represents an identifier to identify the lot that the wafer belonged to from which the investigated substrate originated and was cut. Other codes could be implemented as well, for example, the length of the bit sequence is not limited to eight, and/or, for example, the representation of zeros and ones could be vice versa, and/or in reversed order.

The detection of information encoded into the side walls described with reference to FIG. 5 can also be performed with embodiments of the integrated circuit chip that was subject to a etch dicing as will now briefly be described with reference to FIG. 7 which is a sectional side view that illustrates the chip substrate 310 according to some embodiments that result from processing the wafer 100 as described above with reference to FIG. 3. It should be understood that even though the sidewalls 351 that encase substrate 310 features scallops 352, these scallops are artefacts that resulted from etch dicing. Therefore, scallops 352 do not carry any encoded information.

Detection of the scallop code, according to some embodiments, is therefore limited to the portion 180 of the sidewalls that is provided with scallops 181, 182, 183, . . . that encode information. The detection of the scallop code is performed mechanically as described above with reference to FIG. 5 in order to output data that represent the detected profile to a profile detection unit (not shown in FIG. 7) or another processing unit and to extract, from the detected profile, information on a sequence of scallops 181, 182, 183, . . . , and the respective scallop width in order to derive a barcode, such as illustrated in FIG. 6, that is formed in the side wall 180.

Figure 8:
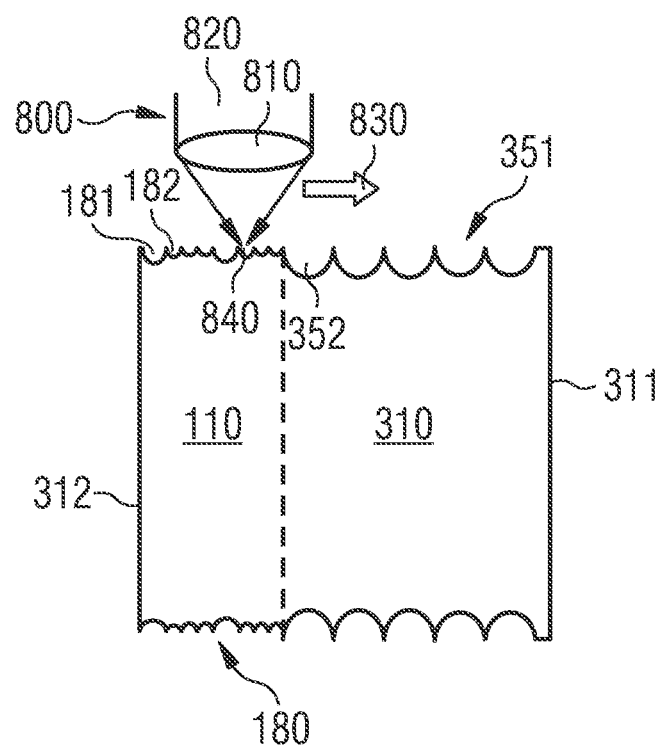
FIG. 8 is a sectional side view that schematically illustrates a performing a pattern detection on a die substrate as illustrated in FIG. 3 according to some embodiments.

FIG. 8 is a diagram schematically illustrating detection of code formed on a substrate 310 according to some embodiments, wherein an optical detection apparatus 800 is used to detect the scallop code. The optical apparatus 800 comprises or is coupled to a source of light (not shown in FIG. 8) and a lens 810 configured to focus a beam of light 820 received from the source of light onto a focal point 840. Further, the optical apparatus 800 encompasses a light detector (not shown in FIG. 8) configured to detect light that is incident to the light detector, in particular to detect light received from a path via the lens 810. The optical detection apparatus 800 is coupled to a control unit (not shown) that is operative to control the optical detection apparatus 800. In some embodiments the control unit is configured to have the optical detection apparatus 800 focus light onto a predetermined focal point 840. In some embodiments the control unit is configured to control and/or drive a motion of the lens 810 in lateral direction with respect to substrate 310. In some embodiments the optical detection apparatus 800 is configured to move the substrate relative to the lens 810.

Scallop code detection according to some implementations using the light detector is now briefly described still with reference to FIG. 8. The optical apparatus is brought with the lens 810 near the sidewall 180 of the substrate 310. More particularly, the lens is positioned above the surface where the sidewall 180 encases the integrated circuit formed atop the substrate 310. The control unit is used to control the optical detection apparatus 800 in order to focus light so as to achieve a focal point essentially in one plane with the surface of the sidewall 180. Light incident to the surface of the sidewall 180 is reflected and depending on substrate material properties as well as surface properties, reflected back via lens 810 to the light detector. The light detector is operated to capture light that was reflected back via the lens 810 to be received at the light detector.

The lens 810 is driven across the surface essentially in a direction 830 that is perpendicular to axes of the code scallops formed in the sidewall 180. As the lens travels across the scallops reflection of light at the surface changes characteristically at the surface along the scallop's cross section, since the inclination of the surface changes and/or since the focal point 820 is out of the plane with the surface that recedes from the crests between scallops to scallop bottoms. In some implementations detected light and/or a signal derived from the detected light that represents the detected profile is output to a profile detection unit (not shown in FIG. 8) or to another processing unit to extract, from the detected profile, information on a sequence of scallops 181, 182, 183, . . . , and the respective scallop width in order to derive the barcode, such as illustrated in FIG. 6, that is formed in the side wall 180.

In another embodiment, rather than detecting a binary code, the code information can be extracted by looking at the pattern of the reflection. This method is especially useful when only a small number of choices are needed to be detected, e.g., the fab of origin.

Figure 9:
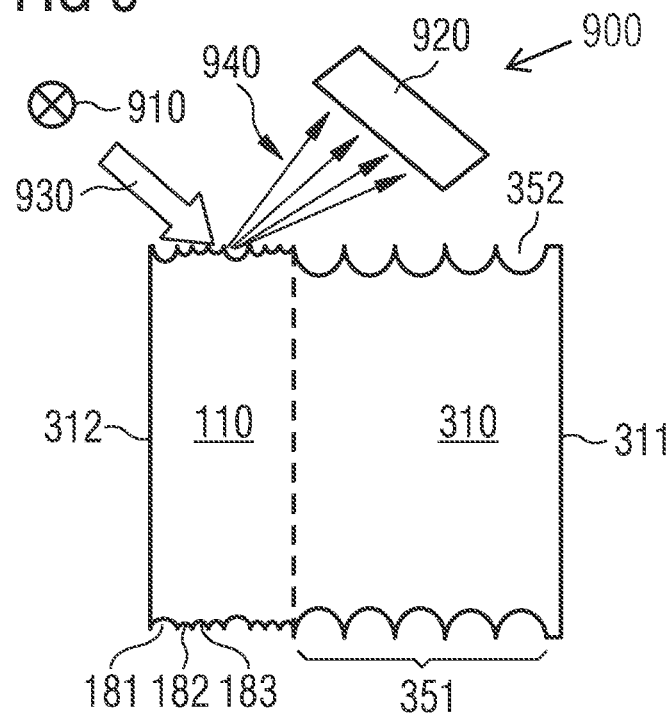
FIG. 9 is a sectional side view that schematically illustrates a performing a pattern detection on a die substrate as illustrated in FIG. 3 according to some embodiments.

FIG. 9 is a diagram schematically illustrating detection of code formed on the substrate 310 described above, for example, with reference to FIG. 3, according to some embodiments, wherein an optical detection apparatus 900 is used to detect the scallop code. The optical apparatus 900 comprises or is coupled to a source of light 910 and a light detector unit 920. The source of light 910 is configured emit a beam of light 930 onto a surface to be examined. In some embodiments the optical apparatus is configured for the beam of light 930 to strike the surface at an angle other than perpendicular. In some embodiments the source of light 930 is configured to emit essentially monochromatic light. In some embodiments the source of light 930 is a laser.

The light detector unit 920 is configured to detect light 940 scattered from the surface that is struck by the light beam 930. The optical detection apparatus 900 is coupled to a control unit (not shown) that is operative to control the optical detection apparatus 900. In some implementations detected light and/or a signal derived from the detected light that represents the detected profile is output to a profile detection unit (not shown in FIG. 9) or to another processing unit to extract, from the detected profile, information on a sequence of scallops 181, 182, 183, . . . , and the respective scallop width in order to derive the barcode, such as illustrated in FIG. 6, that is formed in the side wall 180.

Operation of the optical detection apparatus 900 according to some implementations will now briefly be described still with reference to FIG. 9. The source of light 910 is set to the substrate 310 so as to shine the beam of light 930, at an angle other than perpendicular, onto the sidewall 180. The surface of the sidewall 180 including the scallops 181, 182, 183, . . . reflects the light as scattered light 940 towards the light detector 920. The light detector derives a detection signal and outputs the same to a processing unit (not shown) that is coupled to the optical detection apparatus 900. The processing unit processes the detection signal so as to extract the bit sequence that is encoded in the scallops 181, 182, 183, . . . .

In some implementations the optical detection apparatus 900 is static, i.e., once the apparatus is set to shine the light onto the surface of the sidewall 180, the beam of light 930 is not moved relative to the substrate 310. In some implementations the optical detection apparatus 900 is dynamic, i.e., the source of light 910, and/or the light detector 920 are configured to be moved relative to the surface of the sidewall 180 while scattered light 940 is detected, and/or between separate 'images' of the scattered light 940 are taken at the light detector 920. In some implementations a signal is derived from the detected light and output to the profile detection unit (not shown in FIG. 9) in order to extract, from the signal information on a sequence of scallops 181, 182, 183, . . . , and the barcode, such as illustrated in FIG. 6, that the scallops form in the side wall 180.

Figure 10:
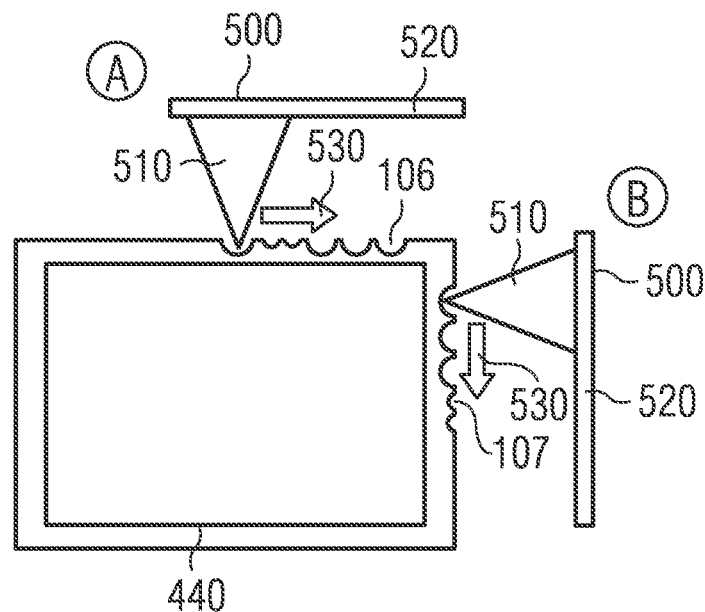
FIG. 10 is a diagram schematically illustrating a top side view on the die substrate separated from a wafer as illustrated in FIG. 4 according to some embodiments.

Now, detection of position information encoded adjacent the active portions 410, 420, 430, 440 will be described with reference to FIG. 10 which is a top view which illustrates the chip substrate including the active portion 440 according to some embodiments as described above with reference to FIG. 4.

In some implementations, as described above with reference to scallop code formed in the side wall 180 to encode, for example, an identifier of the lot that the wafer of origin 100 of the chip substrate with the active portion 440 belonged to, detection of the scallop code is performed mechanically. For example, in a first step (A) the profilometer 500 is used to detect the sequence of scallops 441, 442, 443, . . . , and the respective scallop width in order to derive a first barcode; in a second step (B) the profilometer 500 is used to detect the sequence of scallops 446, 447, 448, . . . , and the respective scallop width in order to derive a second barcode (see FIG. 11B) that is formed adjacent to the active portion 440 so as to represent the line in the array provided on the wafer of origin 100 that the active portion 440 belonged to. In some implementations the first step (A) and the second step (B) are performed simultaneously. In some implementations the first step (A) is performed prior to, or after the second step (B). Should be understood, that any of the detection apparatus and methods described above with reference to detection of scallops formed in the sidewall of the chip substrate 210, 310 can also be applied to detection of scallops formed adjacent to the active portion 410, 420, 430, 440 to encode the field of the array of active portions provided on wafer 100 of origin.

Figure 11A:
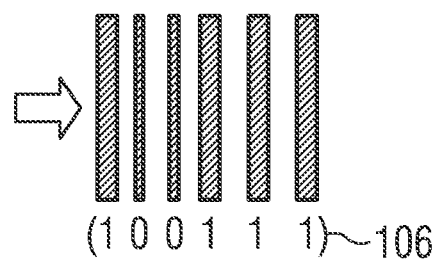
FIGS. 11A and 11B illustrate barcodes according to some embodiments.
Figure 11B:
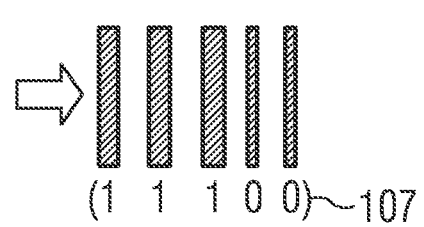

FIGS. 11A and 11B illustrate barcodes according to some embodiments. An example of the first barcode is illustrated in FIG. 11A. The first barcode represents the 6-bit sequence (100111) as shown, for example, at reference numeral 106.

As described above with reference to FIG. 4, the 6-bit sequence represents an identifier to identify the column in the array provided on the wafer 100 that the active portion 440 belonged to prior to separation from the wafer 100. In particular, in some embodiments of the scattering method as described above with reference to FIG. 9, scallop code that encode information about the wafer lot that included the wafer of origin and scallop code that encodes information on the position of the inspected integrated circuit chip substrate on the wafer of origin can simultaneously be detected.

An example of the second barcode is illustrated in FIG. 11B. The second barcode represents the 5-bit sequence (11100) as shown, for example, at reference numeral 107. As described above with reference to FIG. 4, the 6-bit sequence represents an identifier to identify the column in the array provided on the wafer 100 that the active portion 440 belonged to prior to separation from the wafer 100.

As described above, other codes could be implemented as well, for example, the length of the bit sequence is not limited to five and six, respectively, and/or, for example, the representation of zeros and ones could be vice versa, and/or in reversed order.

Below, further embodiments, implementations and associated effects are disclosed.

This description, in an aspect according to some embodiments, describes a method for use in manufacturing integrated circuit chips. Some implementations of the method comprises receiving a wafer having a plurality of integrated circuits provided in active areas, herein also referred to as active portions. The method comprises providing the integrated circuits with a signature, herein also referred to as code pattern. In some embodiments the code pattern is provided outside the active area.

In some embodiments the method comprises removing material from the wafer so as to form one or more scribe line trenches, herein also referred to as scribe lines, outside the active area so as to separate active areas from one another. At least one effect can be that the code pattern can be used to represent information specific to the manufacturing process such as an identifier of a lot that the wafer, herein also referred to as wafer of origin, belonged to, and/or an identifier of a column in an array formed on the wafer of origin to include the active area, and/or an identifier of a line in the error a formed on the wafer of origin to include the active area.

In some embodiments of the method the code pattern is provided on a side wall of the one or more scribe line. In some embodiments the removing the material is performed by anisotropic etching. In some implementations the removing the material is performed by dry etching. In some embodiments the dry etching is reactive ion etching. In some embodiments the method comprises, when removing the material to form the code pattern, varying a rate of material removal per unit time. At least one effect can be that variation allows to impress, i.e., to modulate a signal onto the removal rate, whereby information represented by the signal can be encoded in a relief, herein also referred to as silhouette, created and/or formed in the side wall as a result of the removal. Accordingly, in some implementations the method comprises controlling the rate of material removal such that the code pattern represents different rates of material removal at different times during the removal of material. In some embodiments the code pattern represents information associated with a wafer lot that includes the wafer.

In some embodiments a laser is used to write the code pattern onto the side wall. In some embodiments an indenter, in particular a micro indenter is used to emboss the code pattern onto the die outside the active area, for example onto the side wall. In some embodiments a lithographic method is used to form the code pattern on the die outside the active area, for example, in or on the side wall.

At least one effect of providing the code pattern outside the active area can be that, when working with and/or processing wafers of different lots, the manufacturing apparatus can form different code patterns, wherein the different code patterns are associated with the different lots. Thus, code pattern can be indicative of a lot and can be used to identify the lot of origin of a given die. In some implementations of the method the code pattern represents information indicative of the wafer that is, from the die's point of view, to become the wafer of origin for that die. In some implementations the code pattern is associated with a position of the die on the wafer.

In some embodiments the code pattern represents information indicative of at least one of a column position co-ordinate and a line position in an array of active areas provided on the wafer. In some implementations the fields in the array are to be separated and to become integrated circuit chip dies. At least one effect can be that the position of the die on the wafer can still be identified after the die was separated from the wafer. In an implementation where both, wafer lot and die position, are coded onto the die, the die is uniquely identified to have formed part of one wafer lot and to have been worked upon at one position of a wafer in that lot.

This description, in an aspect according to some embodiments, describes a computer-readable medium holding instructions that, when executed, cause a processor (e.g., a microprocessor) to perform steps in control of a manufacturing tool to implement the above-described method. In an aspect according to some embodiments the description describes a computer-readable medium holding instructions that, when executed, cause a processor to control performance of the following steps of a manufacturing tool: holding a wafer comprising a plurality of integrated circuits provided in active areas; removing material from the wafer so as to form one or more scribe line trenches between active areas; and providing a code pattern outside active areas.

Implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system to perform method steps.

One embodiment includes a processing means, for example a computer, or a programmable logic device, configured to or adapted to control performance of one of the methods described herein.

This description, in another aspect according to some embodiments, describes a manufacturing apparatus, herein also referred to as semiconductor manufacturing apparatus, configured as a tool for use in manufacture of semiconductor integrated circuit chips. The manufacturing apparatus is configured to receive a wafer and to remove material from the wafer so as to form trenches between active areas. The semiconductor manufacturing apparatus is further configured to provide code pattern outside the active areas. In some embodiments the code pattern is to be provided on a trench side wall.

In some embodiments the semiconductor manufacturing apparatus is configured to perform anisotropic etching so as to remove the material. In some implementations the anisotropic etching is performed by plasma etching. In some embodiments the semiconductor manufacturing apparatus is configured to vary a rate of material removal per unit time. At least one effect can be that, provided suitable control of the removal operation, the code pattern can thus be formed. In some embodiments the manufacturing apparatus is configured to control the rate of material removal such that the code pattern is formed to reflect different rates of material removal at different times during the removal of material in accordance with the code pattern to represent information associated with a wafer lot that includes the wafer subject processing by the semiconductor manufacturing apparatus.

At least one effect can be that, when processing and/or working on wafers of different lots, the semiconductor manufacturing apparatus can form different code patterns, wherein the different code patterns are associated with the different lots. Thus, a code pattern can be indicative of a lot and can be used to identify the lot of origin of a given integrated circuit chip die. In some implementations the information encoded by the code pattern is represented according to a standard. In some implementations the standard is a SEMI® standard. In some implementations the information is represented according to a specification of SEMI's "Serial Alphanumeric Marking of the Front Surface of Wafers" such as the SEMI M12-0706 standard. In some implementations information encoded in the code pattern, for example information that identifies the lot of origin that the die substrate belonged to prior to the step of dividing the wafer of origin up into dies, is represented in accordance with a JEDEC® standard.

In some embodiments the method further comprises at least one dicing step wherein material is removed to deepen the scribe line trenches until the wafer is divided up in separate die substrates. In some embodiments pattern scallops are formed in a die side wall portion that encases the active area. In some embodiments of the method, where anisotropic etching is performed to divide up the wafer into die substrates, the method comprises forming dicing scallops the die side wall that encase a die substrate below a level of the integrated circuit on the die substrate. In some embodiments the pattern scallops are less wide than dicing scallops.

In some implementations the code pattern represents information indicative of the wafer. In some implementations the code pattern associated with a position of the die in the wafer. At least one effect can be that a position of the die in the wafer can still be identified after the die was separated from the wafer. In an implementation where both, wafer lot and die position, are coded onto the die, the die is identified to have formed part of one wafer lot and to have been worked upon at one position of a wafer in that lot. At least one effect can be that a malfunction in operation of an integrated circuit chip can be investigated in light of a position of the integrated circuit chip die in the wafer of origin and/or in light of the particular lot that the wafer of origin belonged to.

This description in a further aspect according to some embodiments describes a wafer comprising one or more scribe lines configured for use in separation of the wafer into a plurality of dies, wherein the one or more scribe lines are formed as a trench having side walls, and wherein the sidewalls carry a pattern. In some implementations the pattern encodes information. In some embodiments the information is indicative of a lot that the wafer belonged during processing of the wafer. In some embodiments the information is indicative of a position of the die in the wafer during processing of the wafer.

In yet another aspect according to some embodiments the description describes an integrated circuit (IC) die comprising an integrated circuit and originating from a wafer of origin that included a plurality of the same integrated circuits, wherein the IC die comprises a pattern that represents at least one code of a group of codes consisting of: a code associated with a lot that included the wafer of origin, a code uniquely identifying a position of the IC die on the wafer of origin, a code uniquely identifying a raw that included the IC die in an array of same integrated circuits on the wafer of origin, a code uniquely identifying a column that included the IC die in the array of same integrated circuits on the wafer of origin, a code uniquely identifying a distance of the IC die location from a center of the wafer of origin, and a code uniquely identifying a rotational angle of the IC die location on the wafer of origin.

In an aspect according to some embodiments disclosed herein is a lithographic mask for use in a manufacturing process to manufacture a plurality integrated circuit chip substrates to comprise the same integrated circuit on a wafer, wherein the mask is configured to provide each integrated circuit chip with a pattern that represents at least one code of a group of codes consisting of: a code associated with a lot that included the wafer of origin, a code uniquely identifying a position of the IC die on the wafer of origin, a code uniquely identifying a raw that included the IC die in an array of same integrated circuits on the wafer of origin, a code uniquely identifying a column that included the IC die in the array of same integrated circuits on the wafer of origin, a code uniquely identifying a distance of the IC die location from a center of the wafer of origin, and a code uniquely identifying a rotational angle of the IC die location on the wafer of origin.

In still another aspect according to some embodiments the description describes an integrated circuit chip comprising a substrate originating from a wafer of origin, the substrate carrying an integrated circuit and a code pattern associated with a lot that comprised the wafer of origin.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein.

Other permutations and combinations of the above-disclosed concepts are also contemplated as falling within the scope of the disclosure. The disclosure includes all such modifications and alterations and is limited only by the scope of the following claims. In particular having regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure.

While a particular feature of the disclosure may have been disclosed with respect to only one of several implementations, such feature may be combined with one or more other features of the other implementations as may be desired and advantageous for any given or particular application.

It is intended that this invention be limited only by the claims and the equivalents thereof.

Exemplary implementations/embodiments discussed herein may have various components collocated; however, it should be appreciated that the components of the arrangements may be combined into one or more apparatuses.

The implementations herein are described in terms of exemplary embodiments. However, it should be appreciated that individual aspects of the implementations may be separately claimed and one or more of the features of the various embodiments may be combined.

In some instances, well-known features are omitted or simplified to clarify the description of the exemplary implementations.

In the above description of exemplary implementations, for purposes of explanation, specific numbers, materials configurations, and other details are set forth in order to better explain the invention, as claimed. However, it will be apparent to one skilled in the art that the claimed invention may be practiced using different details than the exemplary ones described herein.

The inventors intend the described exemplary embodiments/implementations to be primarily examples. The inventors do not intend these exemplary embodiments/implementations to limit the scope of the appended claims. Rather, the inventors have contemplated that the claimed invention might also be embodied and implemented in other ways, in conjunction with other present or future technologies.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, articles of manufacture, and/or computer-readable instructions as indicated by the context described herein.

As used herein, the term 'or' is intended to mean an inclusive 'or' rather than an exclusive 'or.' That is, unless specified otherwise or clear from context, 'X employs A or B' is intended to mean any of the natural inclusive permutations. That is, if X employs A; X employs B; or X employs both A and B, then 'X employs A or B' is satisfied under any of the foregoing instances.

As used herein, the articles 'a' and 'an' should generally be construed to mean 'one or more,' unless specified otherwise or clear from context to be directed to a singular form.

The order in which the embodiments/implementations and methods/processes are described is not intended to be construed as a limitation, and any number of the described implementations and processes may be combined.

As used herein, the terms 'coupled' and 'connected' may have been used to describe how various elements interface. Unless expressly stated or at least implied otherwise, such described interfacing of various elements may be either direct or indirect.

As used herein, the terms 'having', 'containing', 'including', 'with' or variants thereof, and like terms are open ended terms intended to be inclusive. These terms indicate the presence of stated elements or features, but do not preclude additional elements or features.

As used herein, directional terminology, such as 'top', 'bottom', 'front', 'back', 'leading', 'trailing', etc., is used with reference to the orientation of the figure(s) being described.

As used herein, terms such as 'first', 'second', and the like, are also used to describe various elements, regions, sections, etc. and are also not intended to be limiting.

As used herein, the wording 'information associated with X' and the wording 'information indicative of X' are used as synonyms that mean the information can be used in determining X. In some embodiments the information is X itself, in some embodiments, using the information, X can be derived. For example, if a code pattern is to represent the information, knowledge about a rule on how information is coded to form the code pattern is needed in order to derive X.

What is claimed is:

1. A method comprising:
   providing a wafer having a plurality of active areas, each active area being provided in a separate die area;
   removing material from the wafer so as to form one or more scribe line trenches outside the active areas, wherein a code pattern is formed on a side wall of the one or more scribe line trenches; and
   for each active area, providing the code pattern outside the active area, the code pattern being associated with the die area.

2. The method of claim 1, wherein removing the material is performed essentially by anisotropic etching.

3. The method of claim 2, wherein the anisotropic etching is performed in a plurality of cycles, each cycle including an isotropic plasma etching phase followed by a passivation phase, the code pattern being provided by varying a time duration of ones of the isotropic plasma etching phases.

4. The method of claim 1, wherein removing the material comprises varying a rate of material removal per unit time to form the code pattern.

5. The method of claim 4, further comprising dicing the wafer wherein material is removed to deepen the scribe line trenches until the wafer is divided up in separate and individual die areas, wherein pattern scallops formed in a die substrate side wall that encases the active area are less wide than dicing scallops formed in a die side wall that encases a die substrate below the active area.

6. The method of claim 1, wherein the code pattern represents information associated with a wafer lot that includes the wafer.

7. The method of claim 1, wherein the code pattern is associated with a position of the active area on the wafer.

8. The method of claim 7, wherein the code pattern represents information indicative of at least one of a column position co-ordinate or a line position in an array of active areas provided on the wafer.

9. A method comprising:
   providing a wafer having a plurality of active areas, each active area being provided in a separate die area;
   forming scribe lines that surround the die areas, wherein forming the scribe line is performed in a plurality of cycles, each cycle including an isotropic plasma etching phase followed by a passivation phase, a code pattern being etched in a sidewall of each die area by varying a time duration of ones of the isotropic plasma etching phases; and
   separating the wafer in a plurality of separate dies, each die including the code pattern, which provides information related to the die.

10. A method comprising:
providing a wafer having an array of active areas, each active area being provided in a separate die area;
forming scribe line trenches so that a code pattern is formed for each active area, the code pattern being associated with the die area; and
separating the wafer in a plurality of separated dies, each separated die comprising an associated die area and an associated code pattern,
wherein the code pattern provides information related to the separated die.

11. The method of claim 10, wherein forming scribe line trenches comprises performing a plurality of cycles thereby etching the code pattern in a sidewall of each die area by varying a time duration of the cycles.

12. The method of claim 11, wherein each cycles includes an etching phase followed by a passivation phase.

13. The method of claim 12, wherein the etching phase is an isotropic plasma etching phase.

14. The method of claim 10, wherein the code pattern represents information associated with a wafer lot that includes the wafer.

15. The method of claim 10, wherein the code pattern is associated with a position of the active area on the wafer.

16. The method of claim 15, wherein the code pattern represents information indicative of at least one of a column position co-ordinate and a line position in the array of active areas provided on the wafer.

17. The method of claim 10, wherein the code pattern comprises a pattern of scallops formed in a side wall of the separated die.

* * * * *